United States Patent [19]
Chen et al.

[11] Patent Number: 5,713,208
[45] Date of Patent: Feb. 3, 1998

[54] THERMOELECTRIC COOLING APPARATUS

[75] Inventors: Jie Chen, Coralville; Joseph R. Adamski; Ali Goshayeshi, both of Cedar Rapids; Bruce Janvrin, Coralville, all of Iowa

[73] Assignee: Amana Refrigeration Inc., Amana, Iowa

[21] Appl. No.: 627,868

[22] Filed: Apr. 3, 1996

[51] Int. Cl.⁶ .......................... F25B 21/02; F25D 17/04
[52] U.S. Cl. ........................ 62/3.7; 62/406; 62/434
[58] Field of Search ............................. 62/3.2, 3.3, 3.6, 62/3.7, 406, 434; 136/204

[56] References Cited

U.S. PATENT DOCUMENTS

| | | | |
|---|---|---|---|
| 4,977,953 | 12/1990 | Yamagishi et al. | 165/10 |
| 5,111,664 | 5/1992 | Yang | 62/3.62 |
| 5,269,146 | 12/1993 | Kerner | 62/3.6 |
| 5,277,030 | 1/1994 | Miller | 62/3.2 |
| 5,499,504 | 3/1996 | Mill et al. | 62/3.3 |
| 5,505,046 | 4/1996 | Nelson et al. | 62/3.6 |

*Primary Examiner*—William Doerrler
*Attorney, Agent, or Firm*—Marshall, O'Toole, Gerstein, Murray & Borun

[57] ABSTRACT

A thermoelectric cooling apparatus includes a plurality of thermoelectric coolers each having a hot side and a cold side. The cold sides of the thermoelectric coolers are arranged to cool an object. The hot sides of the thermoelectric coolers are provided with a heat sink. The heat sink may include a eutectic material which maintains the hot sides of the thermoelectric coolers at a low temperature so that the cold sides of the thermoelectric coolers are able to maintain the object at a cold temperature. The heat sink may have fins for rejecting heat, and air moving means for moving air over the fins to aid in the rejection of heat from the hot sides of the thermoelectric coolers. The fins may be cooled by the eutectic material.

48 Claims, 3 Drawing Sheets

THERMOELECTRIC COOLING APPARATUS

TECHNICAL FIELD OF THE INVENTION

The present invention is directed to a thermoelectric cooling apparatus including a thermoelectric cooler and a heat sink for cooling a hot side of the thermoelectric cooler. The heat sink is a eutectic material for cooling the hot side of the thermoelectric cooler and/or is external to a receptacle of the thermoelectric cooling apparatus so that air can be moved over the heat sink in order to cool the hot side of the thermoelectric cooler.

BACKGROUND OF THE INVENTION

One common approach of cooling and/or freezing objects such as foods, drinks, medicines, specimens, samples, instruments, and the like, is to use a conventional tube and fin evaporator. The tube and fin evaporator is typically enclosed in a small chamber and is used in conjunction with, and is external to, an apparatus to be cooled such as a freezer, a refrigerator, a plate, and/or the like. A fan is used to circulate air through ducts past the evaporator and to the apparatus to be cooled. A compressor compresses a heat exchange fluid which is circulated between a condenser and the evaporator. The evaporator, thus, picks up heat from the objects to be cooled or frozen, and this heat is transferred by the heat exchange fluid from the evaporator to the condenser where it is rejected to ambient. Such conventional tube and fin evaporator refrigeration systems are typically able to cool objects to a temperature ranging from about −20° F. to about +40° F.

However, these systems have a number of problems. For example, access to the low temperature components thereof (such as the heat exchanger, refrigeration tubes, and the like) is fairly difficult making modifications to, and servicing of, these systems very expensive. Also, the mass and complexity of such systems make quick freezing difficult.

Thermoelectric cooling apparatuses are also known. A thermoelectric cooling apparatus typically comprises a plurality of thermoelectric coolers. Each thermoelectric cooler is comprised of two dissimilar metals connected so as to form a junction. When electricity is passed through the two dissimilar metals, a temperature difference is established between the two dissimilar metals. Thus, this temperature difference is established across the junction. The hotter of the two dissimilar metals forms a hot side of the thermoelectric cooler, and the colder of the two dissimilar metals forms a cold side of the thermoelectric cooler. The cold sides of the plurality of thermoelectric coolers are positioned in heat transfer relationship to the objects to be cooled or frozen so that heat is removed from the objects, and the objects are thereby cooled. The hot sides of the plurality of thermoelectric coolers are positioned in heat transfer relationship to a heat sink so that the heat removed from the objects can be rejected. Furthermore, it is known that if the temperature of the hot sides of the thermoelectric coolers is reduced by a predetermined amount, the temperature of the cold side is accordingly also reduced by the predetermined amount.

However, these known thermoelectric cooling apparatuses do not easily provide a stable temperature because, in order to provide a stable temperature, very complex apparatus is required. Moreover, as discussed above, a standard technique of operating a thermoelectric cooling apparatus is to provide a heat sink for the hot sides of the thermoelectric coolers. This heat sink typically uses water or air cooling to remove the heat from the hot sides of the thermoelectric coolers. Such a heat sink does not easily produce a stable temperature for the hot sides of the thermoelectric coolers. If the hot side temperature of a thermoelectric cooling apparatus is not stable, the cold side temperature of the thermoelectric cooling apparatus is likewise not stable, i.e., the cold side temperature is not even.

The present invention solves one or more of these problems.

SUMMARY OF THE INVENTION

In accordance with one aspect of the present invention, a thermoelectric cooling apparatus comprises a thermoelectric cooling means and a heat sinking means. The thermoelectric cooling means has hot and cold sides, and the cold side of the thermoelectric cooling means is arranged to cool an object. The heat sinking means heat sinks the hot side of the thermoelectric cooling means and includes a eutectic material.

In accordance with another aspect of the present invention, a thermoelectric cooling apparatus comprises a receptacle, a thermoelectric cooling means, a heat sinking means, and an air moving means. The receptacle has a cavity. The thermoelectric cooling means thermoelectrically cools an object and has hot and cold sides. The cold side of the thermoelectric cooling means is arranged to cool the cavity. The heat sinking means heat sinks the hot side of the thermoelectric cooling means. The air moving means moves air over the heat sinking means.

In accordance with yet another aspect of the present invention, a thermoelectric cooling apparatus comprises a thermoelectric cooler and a eutectic heat sink. The thermoelectric cooler is arranged to thermoelectrically cool an object and has hot and cold sides. The cold side of the thermoelectric cooler is arranged to cool the object. The eutectic heat sink is arranged to heat sink the hot side of the thermoelectric cooler.

BRIEF DESCRIPTION OF THE DRAWINGS

These and other features and advantages of the present invention will become more apparent from a detailed consideration of the invention when taken in conjunction with the drawings in which.

DETAILED DESCRIPTION

Figure 1:
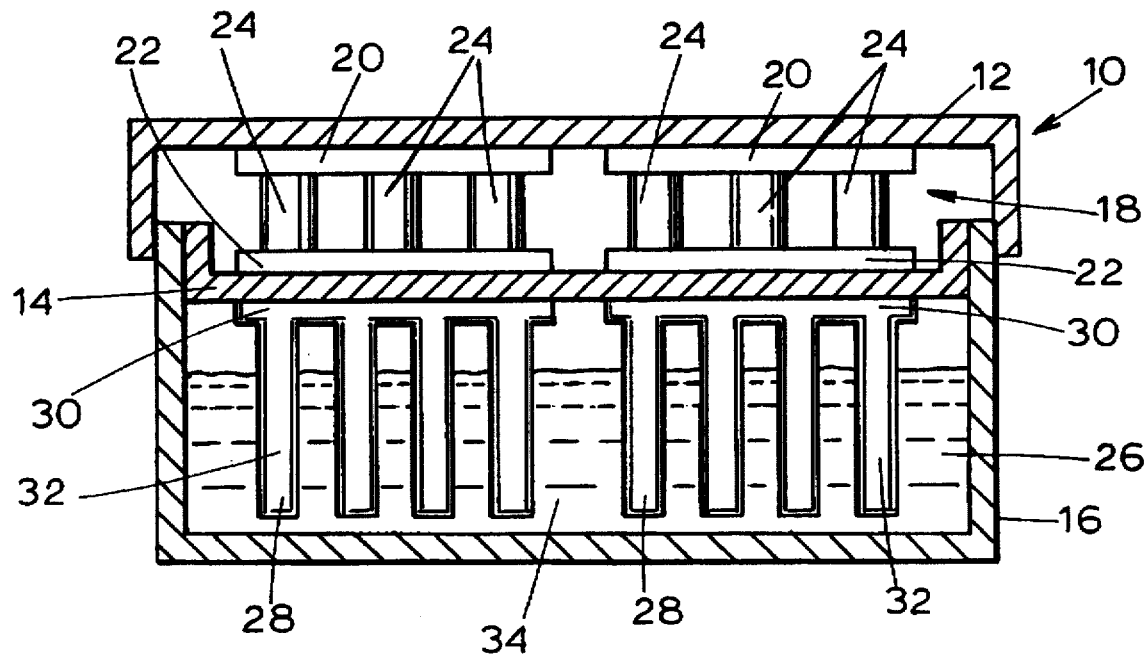
FIG. 1 is a cross-sectional diagram of a thermoelectric cooling plate which incorporates the present invention.
Figure 2:
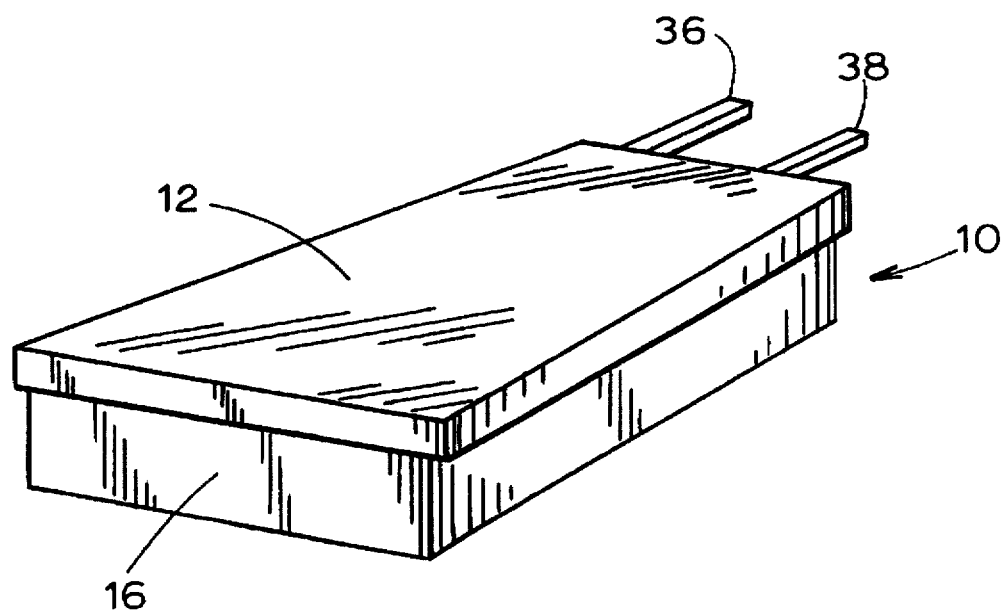
FIG. 2 is an isometric view of the thermoelectric cooling plate shown in FIG. 1.

As illustrated in FIG. 1, a thermoelectric cooling apparatus 10 includes a cover 12, a heat exchanger in the form of a mounting plate 14, and a bottom pan 16. As illustrated in FIG. 2, the thermoelectric cooling apparatus 10 may take the form of a thermoelectric cooling plate. Between the cover 12 and the mounting plate 14 is a thermoelectric cooling arrangement 18. The thermoelectric cooling arrangement 18 includes cold side plates 20 positioned in heat transfer relationship (such as abutting relationship) with the cover 12 and hot side plates 22 positioned in heat transfer relationship (such as abutting relationship) with the mounting plate 14.

Between the cold side plates 20 and the hot side plates 22 are a plurality of thermoelectric coolers 24. The thermoelectric coolers 24 may be any suitable thermoelectric coolers such as those supplied by Melcor under catalog number CP 2-127-06L. The cold sides of the thermoelectric coolers 24 are positioned in heat transfer relationship with the cold side plates 20, and the hot sides of the thermoelectric coolers 24 are positioned in heat transfer relationship with the hot side plates 22. When an electric potential of a predetermined polarity is supplied to the thermoelectric coolers 24, the cold sides of the thermoelectric coolers 24 have a temperature which is below the hot sides of the thermoelectric coolers 24. Consequently, because of the heat exchange relationship between the cover 12, the cold side plates 20, and the cold sides of the thermoelectric coolers 24, and because of the heat exchange relationship between the mounting plate 14, the hot side plates 22, and the hot sides of the thermoelectric coolers 24, the cover 12 has a temperature which is lower than the mounting plate 14.

The thermoelectric cooling apparatus 10 also includes a heat sink 26 between the mounting plate 14 and the bottom pan 16. The heat sink 26 includes radiators 28. The radiators 28 have base plates 30 in heat transfer relationship with the mounting plate 14. The radiators 28 also have fins 32 which extend from the base plates 30. The heat sink 26 further includes a eutectic material 34 contained between the mounting plate 14 and the bottom pan 16. The fins 32 of the radiators 28 are at least partially enveloped by the eutectic material 34. The eutectic material 34 may comprise any eutectic material such as a salt hydrate. A salt hydrate which can be used for the eutectic material 34 is $CaCl_2 \cdot 2H_2O$. Alternatively, the eutectic material 34 may comprise propylene glycol or ethyl alcohol and water.

As shown in FIG. 2, the thermoelectric cooling apparatus 10 has a pair of terminals 36 and 38 for carrying electricity to the thermoelectric coolers 24 from a power supply (not shown). When electricity having a first polarity is applied to the thermoelectric coolers 24, the cold side plates 20 are colder than the hot side plates 22. As is known, thermoelectric coolers establish a temperature difference between their cold and hot sides. The temperature difference between the cold side plates 20 and the hot side plates 22 of the thermoelectric cooling apparatus 10 is about 40° C. The temperature relationship between the cold side plates 20 and the hot side plates 22 may be changed by supplying the thermoelectric coolers 24 with electricity of a second polarity which is opposite to the first polarity. Thus, when electricity having the second polarity is applied to the thermoelectric coolers 24, the cold side plates 20 are hotter than the hot side plates 22, and the temperature difference between the cold side plates 20 and the hot side plates 22 is still about 40° C.

As is known, a eutectic material changes phase between its liquid and solid phases at the eutectic temperature, which is referred to herein as the phase change temperature. However, until the eutectic material completely changes to its liquid phase or to its solid phase (i.e., during that period of time when the eutectic material is at its phase change temperature), its phase change temperature stays substantially constant. Specifically, the eutectic material 34 may be selected to change phase at about −10° C. Thus, as the thermoelectric cooling arrangement 18 pumps (i.e., transfers) heat from the cover 12 to the mounting plate 14, the eutectic material 34 removes the heat from the mounting plate 14 but maintains its phase change temperature of about −10° C. until the eutectic material 34 melts completely. Accordingly, because the hot side plates 22 are held by the eutectic material 34 at a temperature of about −10° C., and because there is about a 40° C. temperature difference between the cold side plates 20 and the hot side plates 22, the cover 12 is maintained at a temperature of about −50° C.

Because of the temperature stability of the eutectic material 34 at its phase change temperature, i.e., because it maintains its phase change temperature until it melts completely, the heat sink 26 is able to maintain the mounting plate 14 and the hot side plates 22 at a very stable hot side temperature. Because the hot side temperature is very stable, the cold side of the thermoelectric cooling arrangement 18 does not change temperature appreciably. Because the cold side of the thermoelectric cooling arrangement 18 does not change temperature, and because there is a 40° C. temperature difference between the cold side plates 20 and the hot side plates 22, the temperature of the cover 12 is very cold and is very stable.

There may be a tendency for objects which are cooled by the thermoelectric cooling apparatus 10 to freeze to the cover 12. Accordingly, the cover 12 may be coated with a non-stick material in order to prevent objects from being frozen to the cover 12. Alternatively, or in addition to applying a non-stick material to the cover 12, the polarity of the electricity applied to the thermoelectric coolers 24 may be reversed, thereby making the cold sides of the thermoelectric coolers 24 hotter than the hot sides of the thermoelectric coolers 24. The interface between the cover 12 and the object frozen thereto is thereby heated. In this manner, the cover 12 may be heated sufficiently to release the objects frozen thereto.

Any suitable means may be provided to maintain the eutectic material 34 between its completely solid phase and its completely liquid phase. For example, the thermoelectric cooling apparatus 10 may be placed in a temperature controlled freezer and may be used to quick freeze objects. Alternatively, a separate refrigeration device in thermal contact with the bottom pan 16 can be provided for the thermoelectric cooling apparatus 10. The temperature of the eutectic material 34 may be sensed and used to control the refrigeration device. Accordingly, when the temperature of the eutectic material 34 begins to increase above its phase change temperature, the refrigeration device can be turned on to refreeze the eutectic material 34.

The thermoelectric cooling apparatus 10 may be used to quick freeze objects. Quick freezing of foods, for example, extends the foods' preservation times, results in frozen foods having better quality when defrosted, and allows faster access to frozen foods for immediate consumption.

Although not shown in FIG. 2, the thermoelectric cooling apparatus 10 may include a start button, an on light, a recharging light, and a release button. The start button, when activated, causes the thermoelectric coolers 24 to be energized so that the cold side plates 20 are colder than the hot side plates 22; accordingly, objects on the cover 12 may be frozen. The on light, when energized, indicates that the thermoelectric cooling apparatus 10 is in operation. The recharging light, when energized, indicates that the thermoelectric cooling apparatus 10 is being recharged (i.e., that the eutectic material 34 is being refrozen). The release button, when activated, causes the thermoelectric coolers 24 to be energized so that the cold side plates 20 are warmer than the hot side plates 22; accordingly, objects which are frozen to the cover 12 may be released as described above.

Figure 3:
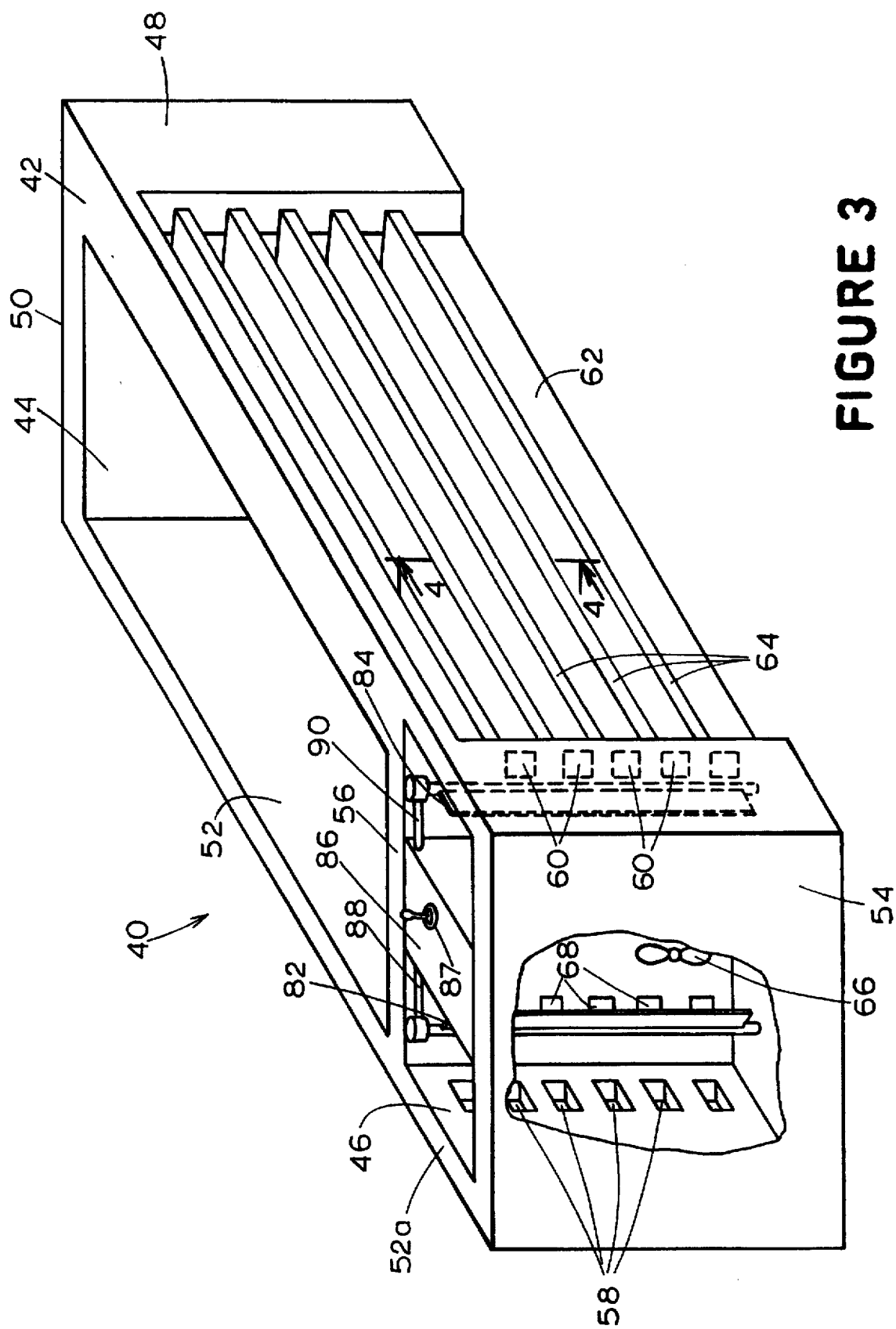
FIG. 3 is an isometric view of a thermoelectrically cooled receptacle according to the present invention.

FIG. 3 shows another thermoelectric cooling apparatus 40 according to the present invention. The thermoelectric cooling apparatus 40 includes a receptacle 42 having a first cavity 44 and a second cavity 46. The receptacle 42 includes walls 48, 50, 52, 54, and 56. In addition, the receptacle 42 may include a floor and a cover (not shown). The first cavity 44 is bounded by the walls 48, 50, 52, and 56, and the second cavity 46 is bounded by the walls 48, 52, 54, and 56. The wall 52 has a wall portion 52a which partially bounds the second cavity 46. The wall portion 52a includes a first set of openings 58 which extends through the wall portion 52a so that the first set of openings 58 allows air to communicate between the second cavity 46 and the exterior of the receptacle 42.

A second set of openings 60 extends through the receptacle 42 between the second cavity 46 and a heat sink area 62. Located within the heat sink area 62 are a plurality of fins 64 which are used to reject heat from the first cavity 44 to the exterior of the receptacle 42. Located within the second cavity 46 is a fan 66 which, when energized, moves air from the exterior of the receptacle 42 through the first set of openings 58, through the second cavity 46, through the second set of openings 60, and over the fins 64 in order to assist the fins 64 in rejecting heat from the first cavity 44.

Figure 4:
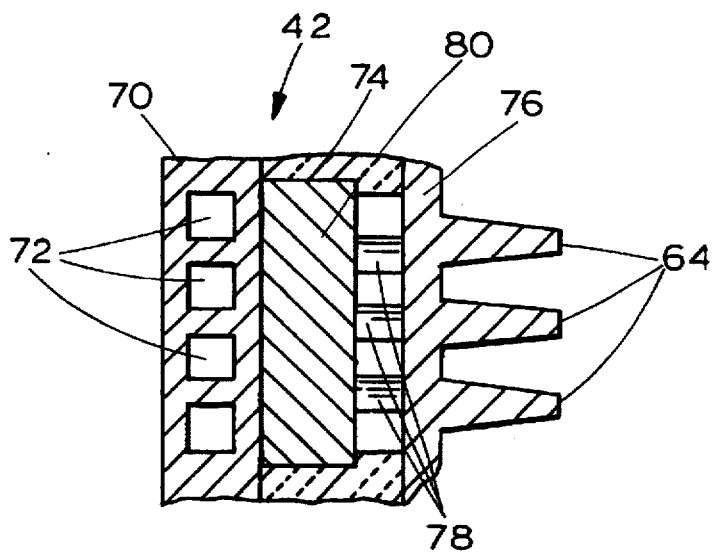
FIG. 4 is a partial sectional view taken along the section lines 4—4 of FIG. 3; and, FIG. 5 is a cross-sectional isometric view of a heat sink which can be used in conjunction with the thermoelectrically cooled receptacle shown in FIG. 3.
Figure 5:
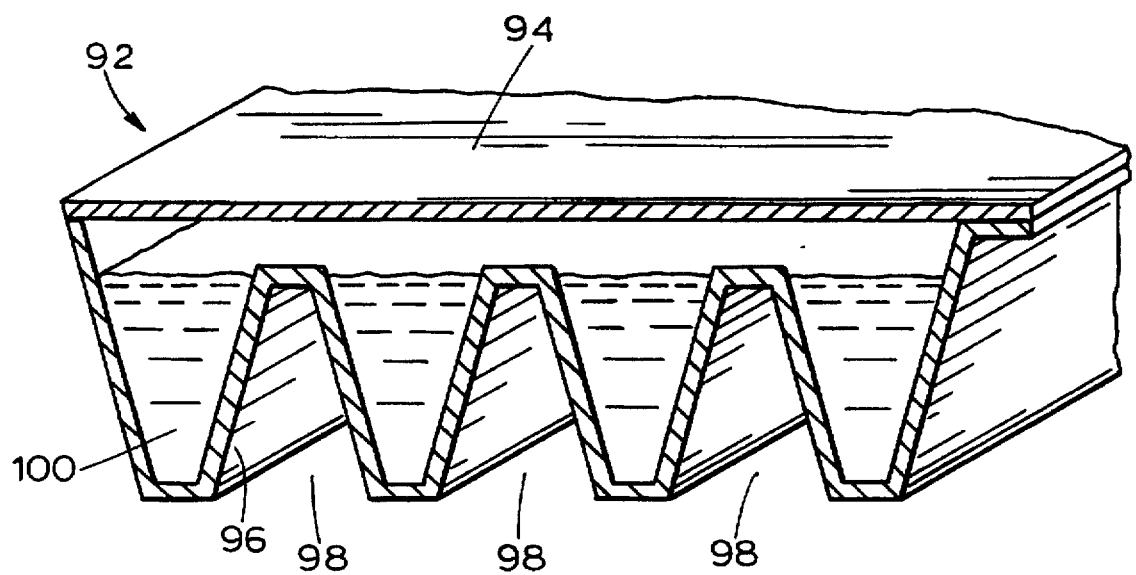

The wall 56 has a third set of openings 68 extending between the first and second cavities 44 and 46. Also, as shown in FIG. 4, the wall 48 includes a heat exchanger 70 which has a fourth set of openings 72. The fourth set of openings 72 extends through the wall 48 from the second cavity 46, extends along most of the length of the wall 48, and communicates with the first cavity 44 near the wall 50 in order to support circulation of air between the first and second cavities 44 and 46. The wall 48 also includes insulation 74 between the heat exchanger 70 and a fin plate 76. The fins 64 and the fin plate 76 may be constructed as a single piece, or the fins 64 may be suitably attached to the fin plate 76. Within the wall 48 are a plurality of thermoelectric coolers 78 having corresponding cold sides abutting a heat transfer block 80 and corresponding hot sides abutting the fin plate 76. The heat transfer block 80 abuts the heat exchanger 70.

A first damper 82 is located within the second cavity 46. The first damper 82 has a first position which opens the first set of openings 58 and closes off the third set of openings 68, and a second position which opens the third set of openings 68 and closes off the first set of openings 58. A second damper 84 is also located within the second cavity 46. The second damper 84 has a first position which opens the second set of openings 60 and closes off the fourth set of openings 72, and a second position which opens the fourth set of openings 72 and closes off the second set of openings 60. A control box 86 is located within the second cavity 46 and has output shafts 88 and 90 for driving the first and second dampers 82 and 84 to their corresponding first and second positions. The control box 86 may also have an electrical output (not shown) for driving the fan 66 continuously. Alternatively, the fan 66 may be driven in response to a control device such as a thermostat within the first cavity 44. Thus, if the fins 64 are unable to reject sufficient heat to maintain the temperature within the first cavity 44 adequately cold, the fan 66 can be energized to blow air across the fins 64 to increase the heat rejection capability of the fins 64.

The control box 86 may further have an electrical output (not shown) for supplying electricity to the thermoelectric coolers 78 either continuously or in response to a control device such as a thermostat within the first cavity 44. For this purpose, the control box 86 may receive DC power from an outside source and/or may have a power supply energizable from a pair of AC power terminals.

The control box 86 may contain a motor (not shown) which is responsive to a switch 87 for driving the first and second dampers 82 and 84 between their respective first and second positions. Accordingly, the output shaft 88 of the control box 86 connects the motor to the first damper 82, and the output shaft 90 of the control box 86 connects the motor to the second damper 84.

In a first mode of operating the thermoelectric cooling apparatus 40, the control box may supply to the thermoelectric coolers 78 electricity having a first polarity so that the thermoelectric coolers 78 have a hot side abutting the fin plate 76 and a cold side abutting the heat transfer block 80. Accordingly, the thermoelectric coolers 78 pump heat from the first cavity 44 through the heat exchanger 70, the heat transfer block 80, the thermoelectric coolers 78, the fin plate 76, and the fins 64 to ambient which is external of the receptacle 42.

Also in the first mode, the first and second dampers 82 and 84 are in their corresponding first positions. When the fan 66 is energized, air is drawn into the second cavity 46 through the first set of openings 58, and is expelled from the second cavity 46 through the second set of openings 60 so that the air is moved over the fins 64. The heat, which is pumped from the heat exchanger 70 to the fins 64, may thus be rejected into the ambient. Accordingly, the first cavity 44 of the receptacle 42 may be cooled to a temperature of approximately 0° C.

In a second mode of operating the thermoelectric cooling apparatus 40, a container 92 is applied to the heat sink area 62. The container 92 includes a cover plate 94 and a fin cooling plate 96 having a plurality of fin receiving recesses 98. A eutectic material 100 is contained by the container 92 between the cover plate 94 and the fin cooling plate 96. The container 92 is applied to the heat sink area 62 so that the fins 64 fit snugly within the fin receiving recesses 98 and make heat exchange contact with the fin cooling plate 96. Suitable clamps (not shown) may be provided in order to removably clamp the container 92 to the receptacle 42.

Also in the second mode of operating the thermoelectric cooling apparatus 40, electricity having the first polarity is supplied to the thermoelectric coolers 78 so that the thermoelectric coolers 78 have a hot side abutting the fin plate 76 and a cold side abutting the heat transfer block 80. Accordingly, the thermoelectric coolers 78 pump heat to the eutectic material 100 from the first cavity 44 through the heat exchanger 70, the heat transfer block 80, the thermoelectric coolers 78, the fin plate 76, and the fins 64. The heat exchanger 70 is thereby cooled by the heat transfer block 80.

The first and second dampers 82 and 84 are operated during the second mode in their corresponding second positions. Thus, when the fan 66 is energized, air is drawn from the first cavity 44 through the third set of openings 68 into the second cavity 46, and is returned to the first cavity 44 from the second cavity 46 through the fourth set of openings 72. Accordingly, air circulates through the cooled heat exchanger 70 and the first cavity 44. More specifically, the fan 66 draws air out of the first cavity 44 through the third set of openings 68, through the second cavity 46, through the fourth set of openings 72 in the heat exchanger 70, along the heat exchanger 70, and into the first cavity 44.

The eutectic material 100 may be the same material as the eutectic material 34 used in connection with the thermoelectric cooling apparatus 10. Accordingly, the eutectic material 100 has a phase change temperature of −10° C., but it does not change temperature until it changes from its solid phase to its liquid phase. Also as in the case of the thermoelectric cooling apparatus 10, the eutectic material 100 may be maintained in its partially solid phase by any suitable apparatus. Therefore, the first cavity 44 is maintained at an even temperature of about −50° C.

The thermoelectric cooling apparatus 40 has many uses. For example, during the first mode of operating the thermoelectric cooling apparatus 40, the thermoelectric cooling apparatus 40 may be used as a picnic basket. During the second mode of operating the thermoelectric cooling apparatus 40, the thermoelectric cooling apparatus 40 may be used as a quick freeze device in the same manner as the thermoelectric cooling apparatus 10.

Certain modifications of the present invention have been discussed above. Other modifications will occur to those practicing in the art of the present invention. For example, as described above, the first and second dampers 82 and 84 may be rotated by a motor between their first and second positions. Instead, the first and second dampers 82 and 84 can be manually rotated.

Also, as described above, the thermoelectric cooling apparatus 40 may be operated either in the first mode or in the second mode. Instead, the first and second dampers 82 and 84 could be cycled between their first and second positions. For example, when the first and second dampers 82 and 84 are in their corresponding first positions and when the fan 66 is energized, air is drawn into the second cavity 46 and through the first set of openings 58, and is expelled from the second cavity 46 through the second set of openings 60 so that the air is moved over the fins 64. The heat, which is pumped from the heat exchanger 70 to the fins 64 by the thermoelectric coolers 78, may thus be accordingly rejected into the ambient. Then, when the first and second dampers 82 and 84 are in their corresponding second positions and when the fan 66 is energized, air is circulated through the heat exchanger 70 and the first cavity 44 by use of the third set of openings 68, the second cavity 46, and the fourth set of openings 72. Thus, the coolness of the heat exchanger 70 is imparted to the first cavity 44. The thermoelectric cooling apparatus 40 may be used with or without the container 92.

All such modifications are considered to be within the scope of the present invention as set out in the claims attached hereto.

What is claimed is:

1. A thermoelectric cooling apparatus comprising:
a thermoelectric cooler arranged to thermoelectrically cool an object, wherein the thermoelectric cooler has hot and cold sides, and wherein the cold side of the thermoelectric cooler is arranged to cool the object; and,
a eutectic heat sink arranged to heat sink the hot side of the thermoelectric cooler, wherein the eutectic heat sink contacts the thermoelectric cooler, and wherein the eutectic heat sink has a liquid/solid phase change temperature below 0° C.

2. The thermoelectric cooling apparatus of claim 1 wherein the eutectic heat sink comprises a heat exchanger between the thermoelectric cooler and a eutectic material of the eutectic heat sink, and wherein the heat exchanger is arranged to transfer heat between the hot side of the thermoelectric cooler and the eutectic material.

3. The thermoelectric cooling apparatus of claim 2 wherein the eutectic heat sink comprises fins in the eutectic material, and wherein the fins are arranged to conduct heat between the heat exchanger and the eutectic material.

4. The thermoelectric cooling apparatus of claim 3 wherein the thermoelectric cooler comprises a plurality of thermoelectric coolers, wherein each of the thermoelectric coolers has a cold side and a hot side, wherein the cold side of each of the thermoelectric coolers is arranged to cool an object, and wherein the hot side of each of the thermoelectric coolers is ranged to transfer heat to the heat exchanger.

5. The thermoelectric cooling apparatus of claim 1 wherein the eutectic heat sink comprises fins in a eutectic material of the eutectic heat sink, and wherein the fins are arranged to transfer heat between the thermoelectric cooler and the eutectic material.

6. The thermoelectric cooling apparatus of claim 5 wherein the thermoelectric cooler comprises a plurality of thermoelectric coolers, wherein each of the thermoelectric coolers has a cold side and a hot side, wherein the cold side of each of the thermoelectric coolers is arranged to cool an object, and wherein the hot side of each of the thermoelectric coolers is arranged to transfer heat to the fins.

7. The thermoelectric cooling apparatus of claim 1 wherein the thermoelectric cooler comprises a plurality of thermoelectric coolers, wherein each of the thermoelectric coolers has a cold side and a hot side, wherein the cold side of each of the thermoelectric coolers is arranged to cool an object, and wherein the hot side of each of the thermoelectric coolers is arranged to transfer heat to a eutectic material of the eutectic heat sink.

8. The thermoelectric cooling apparatus of claim 1 wherein the thermoelectric cooler comprises a receptacle having a plurality of sides and a floor forming a cavity, wherein the receptacle has an opening permitting access to the cavity, and wherein the cold side of the thermoelectric cooler is arranged to cool the cavity.

9. The thermoelectric cooling apparatus of claim 8 wherein the eutectic heat sink comprises a heat exchanger located on one of the sides of the receptacle, and wherein the hot side of the thermoelectric cooler is arranged to transfer heat to the heat exchanger.

10. The thermoelectric cooling apparatus of claim 9 wherein the receptacle comprises a fan arranged to move air over the heat exchanger.

11. The thermoelectric cooling apparatus of claim 10 wherein the cavity is a first cavity, wherein the receptacle has a second cavity, wherein the receptacle comprises first and second sets of openings, wherein the first set of openings is between the second cavity and an exterior of the receptacle, wherein the second set of openings is between the second cavity and the heat exchanger, and wherein the fan is arranged to move air from the first set of openings to the second set of openings so that air moves over the heat exchanger.

12. The thermoelectric cooling apparatus of claim 11 wherein the receptacle comprises third and fourth sets of openings, wherein the receptacle includes an air director arranged to have a first position so that air is directed between the first and second sets of openings and so that air is moved by the fan from the first set of openings to the second set of openings in order to move air over the heat exchanger, and wherein the air director is arranged to have a second position so that air is directed between the third and fourth sets of openings and so that air is moved by the fan through the first cavity.

13. The thermoelectric cooling apparatus of claim 12 wherein the heat exchanger is a first heat exchanger, wherein the receptacle includes a second heat exchanger between the first cavity and the cold side of the thermoelectric cooler, and wherein the second position of the air director is arranged to circulate air through the second heat exchanger, the third and fourth sets of openings, and the first cavity.

14. The thermoelectric cooling apparatus of claim 13 wherein the eutectic heat sink comprises a container holding a eutectic material, and wherein the container is configured to fit over the first heat exchanger so that the container and the first heat exchanger cooperate to exchange heat therebetween.

15. The thermoelectric cooling apparatus of claim 14 wherein the container is removably attached to the receptacle.

16. The thermoelectric cooling apparatus of claim 8 wherein the cavity is a first cavity, wherein the receptacle has a second cavity, wherein the receptacle comprises first and second sets of openings and a fan, wherein the first and second sets of openings are between the second cavity and an exterior of the receptacle, wherein the fan is arranged to move air from the first set of openings to the second set of openings, and wherein the second set of openings is arranged to direct the air moved by the fan over the heat exchanger.

17. The thermoelectric cooling apparatus of claim 16 wherein the receptacle comprises third and fourth sets of openings, wherein the receptacle includes an air director arranged to have a first position so that air is directed between the first and second sets of openings and so that air is moved by the fan from the first set of openings to the second set of openings, and wherein the air director has a second position so that air is directed between the third and fourth sets of openings and so that air is moved by the fan through the first cavity.

18. The thermoelectric cooling apparatus of claim 17 wherein the receptacle includes a heat exchanger between the first cavity and the cold side of the thermoelectric cooler, and wherein the second position of the air director is arranged to circulate air through the heat exchanger, the third and fourth sets of openings, and the first cavity.

19. The thermoelectric cooling apparatus of claim 18 wherein the eutectic heat sink comprises a container holding a eutectic material, and wherein the container is configured to remove heat from the hot side of the thermoelectric cooler.

20. The thermoelectric cooling apparatus of claim 8 wherein the receptacle comprises first and second sets of openings and a fan, wherein the fan is arranged to move air through the first and second sets of openings and the cavity.

21. The thermoelectric cooling apparatus of claim 20 wherein the receptacle includes a heat exchanger between the cavity and the cold side of the thermoelectric cooler, and wherein the fan moves air through the first and second sets of openings and the cavity.

22. The thermoelectric cooling apparatus of claim 21 wherein the eutectic heat sink comprises a removable container holding eutectic material, and wherein the removable container is configured to remove heat from the hot side of the thermoelectric cooler.

23. The thermoelectric cooling apparatus of claim 8 wherein the receptacle includes a heat exchanger and a fan, wherein the heat exchanger is between the cavity and the cold side of the thermoelectric cooler, and wherein the fan moves air through the heat exchanger and the cavity.

24. The thermoelectric cooling apparatus of claim 23 wherein the eutectic heat sink comprises a removable container holding a eutectic material, and wherein the removable container is configured to remove heat from the hot side of the thermoelectric cooler.

25. The thermoelectric cooling apparatus of claim 8 wherein the eutectic heat sink comprises a removable container holding a eutectic material, and wherein the removable container is configured to remove heat from the hot side of the thermoelectric cooler.

26. The thermoelectric cooling apparatus of claim 1 wherein the eutectic heat sink comprises a removable container holding a eutectic material, and wherein the removable container is configured to remove heat from the hot side of the thermoelectric cooler.

27. A thermoelectric cooling apparatus comprising;
a receptacle having a floor and a plurality of sides forming first and second cavities, wherein the receptacle has an opening permitting access to the first cavity, and wherein the receptacle comprises first and second sets of openings;
a thermoelectric cooler arranged to thermoelectrically cool the first cavity, wherein the thermoelectric cooler has hot and cold sides, and wherein the cold side of the thermoelectric cooler is arranged to cool the first cavity;
a heat sink arranged to heat sink the hot side of the thermoelectric cooler, wherein the heat sink includes fins formed on one of the sides of the receptacle; and,
a fan arranged to move air over the fins, wherein the fan is arranged to move air into the second cavity through the first set of openings and out of the second cavity through the second set of openings so that air moves over the fins;
wherein the first set of openings is between the second cavity and an exterior of the receptacle, wherein the second set of openings is between the second cavity and the fins, wherein the receptacle comprises third and fourth sets of openings, wherein the receptacle includes an air director arranged to have a first position so that air is directed between the first and second sets of openings and so that air is moved by the fan from the first set of openings to the second set of openings in order to move air over the fins, and wherein the air director has a second position so that air is directed between the third and fourth sets of openings and so that air is moved by the fan through the first cavity.

28. The thermoelectric cooling apparatus of claim 27 wherein the receptacle includes a heat exchanger between the first cavity and the cold side of the thermoelectric cooler, and wherein the second position of the air director is arranged to circulate air through the heat exchanger, the third and fourth sets of openings, and the first cavity.

29. The thermoelectric cooling apparatus of claim 28 further comprising a container holding a eutectic material, and wherein the container is configured to fit over the fins so that the container and the fins cooperate to exchange heat therebetween.

30. The thermoelectric cooling apparatus of claim 29 wherein the container is removably attached to the receptacle.

31. The thermoelectric cooling apparatus of claim 30 wherein the container has fin receiving recesses to receive the fins.

32. A thermoelectric cooling apparatus comprising;
a receptacle having a floor and a plurality of sides forming first and second cavities, wherein the receptacle has an opening permitting access to the first cavity, wherein the receptacle comprises first, second, third, and fourth sets of openings, and wherein the first and second sets of openings are between the second cavity and an exterior of the receptacle;
a thermoelectric cooler arranged to thermoelectrically cool the first cavity, wherein the thermoelectric cooler has hot and cold sides, and wherein the cold side of the thermoelectric cooler is arranged to cool the first cavity;

a heat sink arranged to heat sink the hot side of the thermoelectric cooler, wherein the heat sink includes fins formed on one of the sides of the receptacle; and, a fan arranged to move air over the fins, wherein the fan moves air from the first set of openings to the second set of openings so that air moves over the fins;

wherein the receptacle includes an air director arranged to have a first position for directing air between the first and second sets of openings so that air is moved by the fan from the first set of openings to the second set of openings, and wherein the air director has a second position for directing air between the third and fourth sets of openings so that air is moved by the fan through the first cavity.

33. The thermoelectric cooling apparatus of claim 32 wherein the receptacle includes a heat exchanger between the first cavity and the cold side of the thermoelectric cooler, and wherein the second position of the air director is arranged to circulate air through the heat exchanger, the third and fourth sets of openings, and the first cavity.

34. The thermoelectric cooling apparatus of claim 33 further comprising a container holding a eutectic material, and wherein the container is configured to remove heat from the fins.

35. The thermoelectric cooling apparatus of claim 34 wherein the container has fin receiving recesses to receive the fins.

36. A thermoelectric cooling apparatus comprising;

a receptacle having a floor and a plurality of sides forming a cavity, wherein the receptacle has an opening permitting access to the cavity, and wherein the receptacle comprises first and second sets of openings;

a thermoelectric cooler arranged to thermoelectrically cool the cavity, wherein the thermoelectric cooler has hot and cold sides, and wherein the cold side of the thermoelectric cooler is arranged to cool the cavity;

a heat sink arranged to heat sink the hot side of the thermoelectric cooler, wherein the heat sink includes fins formed on one of the sides of the receptacle; and, a fan arranged to move air over the fins, wherein the fan is arranged to move air through the first and second sets of openings so that air moves over the fins;

wherein the receptacle includes a heat exchanger between the cavity and the cold side of the thermoelectric cooler, and wherein the fan is arranged to move air through the heat exchanger, the first and second sets of openings, and the cavity.

37. The thermoelectric cooling apparatus of claim 36 further comprising a container holding a eutectic material, and wherein the container is configured to remove heat from the fins.

38. The thermoelectric cooling apparatus of claim 37 wherein the container has fin receiving recesses to receive the fins.

39. A thermoelectric cooling apparatus comprising;

a receptacle having a floor and a plurality of sides forming a cavity, wherein the receptacle has an opening permitting access to the cavity;

a thermoelectric cooler arranged to thermoelectrically cool the cavity, wherein the thermoelectric cooler has hot and cold sides, and wherein the cold side of the thermoelectric cooler is arranged to cool the cavity;

a heat sink arranged to heat sink the hot side of the thermoelectric cooler, wherein the heat sink includes fins formed on one of the sides of the receptacle;

a fan arranged to move air over the fins; and, a container holding a eutectic material, wherein the container is configured to remove heat from the heat sinking means;

wherein the receptacle includes a heat exchanger, wherein the heat exchanger is between the cavity and the cold side of the thermoelectric cooler, and wherein the fan moves air through the heat exchanger and the cavity.

40. The thermoelectric cooling apparatus of claim 39 wherein the container has fin receiving recesses to receive the fins.

41. A thermoelectric cooling apparatus comprising;

a receptacle having a floor and a plurality of sides forming a cavity, wherein the receptacle has an opening permitting access to the cavity;

a thermoelectric cooler arranged to thermoelectrically cool the cavity, wherein the thermoelectric cooler has hot and cold sides, and wherein the cold side of the thermoelectric cooler is arranged to cool the cavity;

a heat sink arranged to heat sink the hot side of the thermoelectric cooler, wherein the heat sink includes fins formed on one of the sides of the receptacle;

a fan arranged to move air over the fins; and, a container holding a eutectic material, and wherein the container is configured to remove heat from the fins.

42. The thermoelectric cooling apparatus of claim 41 wherein the container has fin receiving recesses to receive the fins.

43. The thermoelectric cooling apparatus of claim 41 wherein the container is removably attached to the receptacle.

44. A thermoelectric cooling apparatus comprising:

a thermoelectric cooler arranged to thermoelectrically cool an object, wherein the thermoelectric cooler has hot and cold sides, wherein the cold side of the thermoelectric cooler is arranged to cool the object, and wherein the thermoelectric cooler includes heat dissipating fins in thermal contact with the hot side;

a heat sink arranged to heat sink the hot side of the thermoelectric cooler, wherein the heat sink includes a eutectic material enclosed in a container, and wherein the container has fin receiving recesses to receive the heat dissipating fins.

45. The thermoelectric cooling apparatus of claim 44 wherein the container is removably attached to the thermoelectric cooler.

46. A method of cooling an object comprising the following steps:

thermoelectrically cooling the object with a cold side of a thermoelectric cooler;

heat sinking a hot side of the thermoelectric cooler with a eutectic material having a liquid/solid phase change temperature below 0° C.: and, cooling the eutectic material with a temperature below ambient by an apparatus separate from the thermoelectric cooler.

47. The method of claim 46 wherein the step of cooling the eutectic material comprises the step of cooling the eutectic material in a refrigerator.

48. The method of claim 46 wherein the step of cooling the eutectic material comprises the step of cooling the eutectic material in a freezer.

* * * * *